United States Patent
Amano et al.

[11] Patent Number: 5,864,087
[45] Date of Patent: Jan. 26, 1999

[54] THERMOELECTRIC DEVICE

[75] Inventors: Takashi Amano; Naoki Kamiya; Makoto Okabayashi, all of Kariya, Japan

[73] Assignee: Technova Inc., Tokyo, Japan

[21] Appl. No.: 860,557

[22] PCT Filed: Oct. 31, 1996

[86] PCT No.: PCT/JP96/03204

§ 371 Date: Jun. 30, 1997

§ 102(e) Date: Jun. 30, 1997

[87] PCT Pub. No.: WO97/16856

PCT Pub. Date: May 9, 1997

[30] Foreign Application Priority Data

Oct. 31, 1995 [JP] Japan ................................. 7-282971
Oct. 18, 1996 [JP] Japan ................................. 8-276704

[51] Int. Cl.⁶ .......................... H01L 35/02; H01L 35/14; H01L 35/34

[52] U.S. Cl. .......................... 136/225; 136/201; 136/205; 136/238; 136/239; 136/240

[58] Field of Search .................. 136/201, 205, 136/225, 238, 239, 240

[56] References Cited

U.S. PATENT DOCUMENTS

| | | | |
|---|---|---|---|
| 2,694,098 | 11/1954 | Leins | 136/201 |
| 3,071,495 | 1/1963 | Hanlein | 117/212 |
| 3,099,575 | 7/1963 | Hill | 117/212 |
| 3,767,469 | 10/1973 | Flais et al. | 136/225 |
| 4,029,472 | 6/1977 | Micheli et al. | 23/254 E |
| 4,036,665 | 7/1977 | Barr et al. | 136/202 |
| 4,110,124 | 8/1978 | Robertson et al. | 136/236 R |
| 5,033,866 | 7/1991 | Kehl et al. | 374/179 |
| 5,167,723 | 12/1992 | Tsukakoshi | 136/225 |
| 5,665,176 | 9/1997 | Shinohara et al. | 148/33 |

FOREIGN PATENT DOCUMENTS

| | | |
|---|---|---|
| 50-68785 | 6/1975 | Japan . |
| 53-95588 | 8/1978 | Japan . |
| 63-70462 | 3/1988 | Japan . |
| 1-300574 | 5/1989 | Japan . |
| 2-260581 | 10/1990 | Japan . |
| 3-196581 | 8/1991 | Japan . |
| 4-318982 | 11/1992 | Japan . |
| 5-190913 | 7/1993 | Japan . |
| 6-318735 | 11/1994 | Japan . |
| 7-45869 | 2/1995 | Japan . |
| 7-218348 | 8/1995 | Japan . |

*Primary Examiner*—Kathryn L. Gorgos
*Assistant Examiner*—Chrisman D. Carroll
*Attorney, Agent, or Firm*—Jacobson, Price, Holman & Stern, PLLC

[57] ABSTRACT

A thermoelectric device is provided which is good in terms of responsibility to heat, by which a relatively large electric power can be produced, which is good in terms of durability, and which can be manufactured at reduced cost. The thermoelectric device includes a substrate having a thickness of 2.0 mm or less, and a thick-film type thermoelectric material formed on the substrate, and having a thickness of from 0.01 mm to 1.0 mm. The thick-film type thermoelectric material is covered with a glassy coating. By the coating, the thick-film type thermoelectric material is inhibited from coming off, and from deteriorating oxidatively.

28 Claims, 10 Drawing Sheets

THERMOELECTRIC DEVICE

This is a national stage application of PCT/JP96/03204, filed Oct. 31, 1996.

1. Technical Field

The present invention relates to a thermoelectric device, by which a high voltage can be readily obtained, which is good in terms of responsibility to heat, and which is full of oxidation-resistance.

2. Background Art

Thermoelectric devices are devices whose purpose is for directly converting heat to electricity. As for thermoelectric devices, there are bulk thermoelectric devices whose purpose is for producing an electric power, and which is prepared by a fusing process or a sintering process, and thin-film thermoelectric devices whose purpose is for the applications to sensors, and which are formed by CVD or PVD.

The bulk thermoelectric devices have a large volume, and accordingly require a relatively long time to obtain a predetermined output. Moreover, in order to obtain a high voltage, it is necessary to connect a plurality of pairs of thermoelectric devices in series. However, there is a problem in that it is difficult to connect bulk thermoelectric devices. On the other hand, thin-film thermoelectric devices output voltage quickly, but output electric power of extreme weakness.

It is an object of the present invention to provide a thermoelectric device which is quick in terms of responsibility to heat, which exhibits a large thermal electromotive force (or voltage), by which an electric power can be produced in a relatively large quantity, and further which can be manufactured at reduced cost.

DISCLOSURE OF INVENTION

As a result of series of trial and errors for developing a thermoelectric material of high output, the inventors of the present invention discovered that a sufficient electric power can be obtained by thickening a thin-film type thermoelectric material, thereby completing the present invention. For instance, a thick-film thermoelectric device according to the present invention comprises: a substrate having a thickness of 2.0 mm or less; and a pair of thick-film type thermoelectric materials formed on the substrate, having a thickness of from 0.01 mm to 1.0 mm, and including a p-type thermoelectric material and an n-type thermoelectric material, the p-type thermoelectric material and the n-type thermoelectric material connected with each other at an end thereof.

The thick-film type thermoelectric device according to the present invention is extremely thin as a whole, and accordingly can be heated readily to produce a predetermined output for a short period of time. Moreover, despite the film construction, the thermoelectric material is formed as a thick film of 0.01 mm or more, and consequently a relatively large electric power can be obtained. In addition, the thick-film type thermoelectric device according to the present invention can be manufactured by simple operations, such as coating to the substrate, and baking, and accordingly can be manufactured at reduced cost.

BEST MODE FOR CARRYING OUT THE INVENTION

Figure 1:
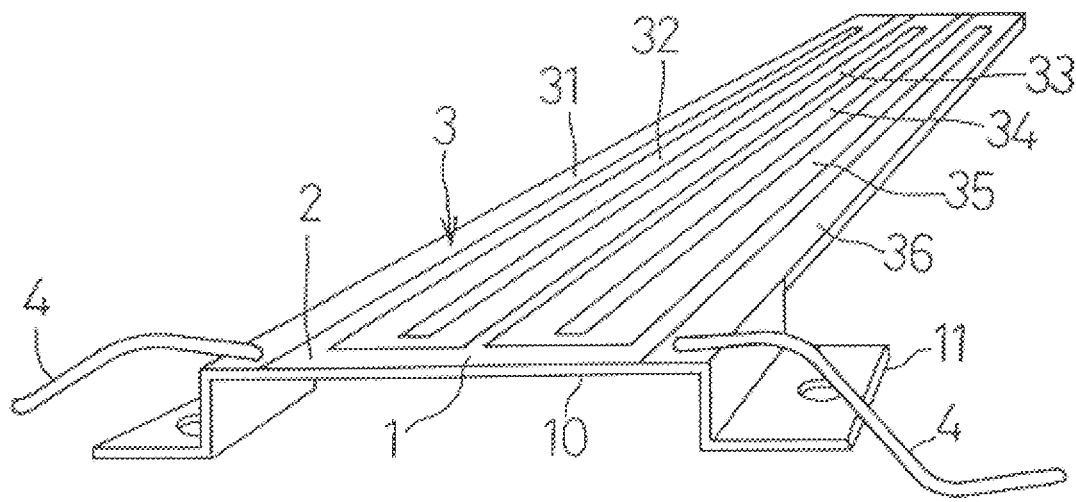
FIG. 1 is a perspective view of a thick-film thermoelectric device according to a preferred embodiment.

A thick-film type thermoelectric device according to the present invention comprises a substrate, and a thick-film type thermoelectric material. The substrate is for holding and fixing the thick-film type thermoelectric material thereon, and is responsible for the mechanical strengths of the present thick-film type thermoelectric device. The substrate can be formed of a highly heat-resistant ceramics, or a metal. The substrate can further preferably be harmless, and less expensive.

The ceramics can preferably be one exhibiting a thermal expansion coefficient of from $6 \times 10^{-6}/°C$ to $13 \times 10^{-6}/°C$. In particular, the ceramics can further preferably be alumina, zirconia, magnesia, or forsterite. A ceramics substrate can preferably have a thickness as thin as possible. It is difficult, however, to prepare a thin ceramics substrate. From the practical point of view, the thickness can preferably fall in a range of from 0.15 to 1.0 mm approximately.

When making a substrate from metal, it is necessary to interpose an insulation layer between the substrate and the thick-film type thermoelectric material in order to guarantee the insulation between the substrate and the thick-film type thermoelectric material. The metal can be a heat-resistant steel exhibiting a thermal expansion coefficient of from $10 \times 10^{-6}/°C$ to $20 \times 10^{-6}/°C$. Taking the high heat-resistance and oxidation-resistance, and the low thermal conductivity into consideration, the heat-resistant metal can preferably be a stainless steel, and can especially preferably be a ferritic stainless steel. Among the ferritic stainless steels, those including Al or Si can further preferably be employed. In addition, the heat-resistance steel can preferably be a heat resistance steel including Ni in an amount of 30% by weight or more.

Comparing metal with ceramics, metal can be made thinner because it is ductile, and accordingly can be heated much more readily. Thus, metal can be heated to a predetermined temperature much faster. A metallic plate forming the substrate can preferably be 2.0 mm or less, and can especially preferably be 0.3 mm or less. Even when a metallic plate is thinned out to such a thickness, the mechanical properties of the substrate can be secured.

The thermal expansion coefficient of the insulation layer can preferably be as close as possible to the thermal expansion coefficient of the thermoelectric material. Further, the thermal expansion coefficient of the insulation layer can preferably be approximated to the thermal expansion coefficient of both of the thermoelectric material and the substrate. It is necessary to form the insulation layer as thin as possible in order to inhibit the metallic substrate from warping, and to secure reliable insulation. Furthermore, the metallic substrate can be inhibited from warping by forming an insulation layer on opposite surfaces of the metallic substrate. The thickness of the insulation layer can preferably fall in a range of from 50 to 300 $\mu$m approximately. As for the insulation layer, a ceramics thin layer can be employed. As for the thin layer, it is possible to employ an insulation and heat-resistance paint whose major component is silica or alumina. Moreover, the insulation layer can be a glassy one.

Regardless of the substrate material; namely; whether the substrate material is either ceramics or metal, the thermoelectric material can be formed on one of the opposite surfaces of the substrate, or can be formed on both of the opposite surfaces of the substrate. When the thermoelectric material is formed on both of the opposite surfaces of the substrate, the material properties are symmetric on both of the opposite surfaces of the substrate. Accordingly, it is possible to effectively inhibit the thermoelectric device from warping at elevated temperatures, warping which results from the difference between the thermal expansibility of the thermoelectric material and that of the substrate. Thus, it is possible to expect an effect of keeping the mechanical strength of the thermoelectric device. In addition, there is another effect available by which an independent device can produce an enlarged electric power.

The present thick-film type thermoelectric material can be constituted by a pair of a p-type thermoelectric material and an n-type thermoelectric material, which are connected with each other at an end thereof. When a higher voltage is required, it is possible to cope with the case by connecting a plurality of pairs of the thick-film type thermoelectric materials in series. Note that a pair of the p-type thick-film type thermoelectric material and the n-type thick-film type thermoelectric material can be connected directly, or they can be connected indirectly by way of another metal or a conductive paste disposed therebetween.

As for the thermoelectric material, it is possible to use ordinary thermoelectric materials. For instance, it is possible to employ the materials which include an iron silicide-based material, a Bi—Te—Sb—Se—based material, an Si—Ge—based material, or a transition metal silicide-based material in an amount of 50 atomic % or more.

Let the composition of iron silicide, which is free from the addition of dopants, be $FeSi_y$, and if iron silicide is a sintered material, the value y should fall in an extremely small range of from 1.95 to 2.05.

In a case of thick-film, when a material having the composition is burned, Si to be formed into the $\beta$-phase is likely to be insufficient because Si is oxidized selectively in burning. In view of the results of experiments, when coating a film, the composition can appropriately be $2 \leq y \leq 4$ in the thick-film type thermoelectric material of the present invention. In particular, y can preferably fall in a range of from 2.5 to 3. When y is 2.5 or less, the Si amount is still insufficient, in addition to the $\beta$-phase, the metallic phases (i.e., low thermoelectric activity phases), such as the $\epsilon$- and $\alpha$-phases, are likely to be involved in a large amount after burning. Moreover, when y is 3 or more, Si is present in excess, and accordingly the Si-phase of high resistivity arises and simultaneously the optimal burning temperature heightens to result in the deteriorated qualities of the resulting film.

The thick-film thermoelectric device of the present invention can be formed by baking its thermoelectric material on the substrate to make a thick-film type thermoelectric material. The porosity of the thus baked thick-film thermoelectric material can preferably be small due to the following reasons. Namely, the lower the porosity of the thick-film thermoelectric material is, the better adhesion to the substrate can be obtained, and the oxidation resistance upgrades. From this point of view, the porosity of the thick-film thermoelectric material can preferably be 40% or less, further preferably 20% or less.

In order to lower the porosity of the thick-film type thermoelectric material, the following bonding process can be employed: namely; the p-type and n-type thermoelectric materials are temporarily fused on the substrate independently to bake them on the substrate, and are connected indirectly by interposing a metal, or a conductive paste, which contains Cu or Ag, between a pair of the resulting p-type and n-type thermoelectric materials. This process of fusing and baking can produce exceptionally good results when iron silicide is used as the thermoelectric material.

When a process is employed in which ends of the p-type and n-type thermoelectric materials are bonded directly, there occur phenomena in which the bonded portion exhibits high resistance, and in which the thermoelectromotive degrades, because the melting points of the p-type and n-type thermoelectric materials differ from each other so that one of the thermoelectric materials is fused at a lower temperature to permeate and diffuse into the unfused thermoelectric material. In order to avoid the phenomena, a baking process is employed in which a powder having a composition of thermoelectric electric material is sintered at a temperature of its melting point or less.

The density of the thermoelectric material, which is prepared by sintering at its melting point or less, is as low as from 60 to 90% of the theoretical density, and the porosity thereof becomes 10 to 40% to lack the oxidation resistance. For reference, Table 1 sets forth the relationships among the burning temperatures, the porosities, and the fused or unfused state when a powder having a composition of $Fe_{0.98}Si_{2.5}Co_{0.02}$ was sintered. The melting point of the alloy having the composition was 1217.5° C., and the porosity enlarges rapidly when the burning temperature became lower than the melting point.

TABLE 1

| Item | Burning Temp. (°C.) | | | |
|---|---|---|---|---|
| | 1,190 | 1,210 | 1,215 | 1217.5 |
| Porosity (%) | 41 | 23 | 13 | 2 |
| Fused or Unfused | Unfused | Unfused | Unfused | Fused |

In order to increase the oxidation resistance of the thermoelectric material which lacks the oxidation resistance because of the low porosity, it is effective to cover it with a glassy coating. The glassy coating covers the thick-film type thermoelectric material so that it improves the oxidation resistance of the thermoelectric material, and so that it enhances the durability thereof, because it can increase the adhesion strength between the thermoelectric material and the substrate, because it can improve the mechanical strength of the device as a whole, and because it can enclose the pores in the thick-film thermoelectric material. Moreover, it is possible to prepare a thick film having a thickness of 0.5 mm or more, which has not been prepared so far, because the adhesion strength is increased. Accordingly, it is possible to design an improvement on the output.

Depending on the properties of the thick-film type thermoelectric material and substrate, the glassy coating can be selected optionally from and prepared by using a ceramic adhesive made of a ceramic filler, an alkali metal silicate binder and some additives, a glass powder, or a metallic alkoxide. An $SiO_2$ film can be formed by coating a ceramic adhesive as an aqueous solution and thereafter by burning it. A glassy film can be formed by coating a glassy powder in a form of paste and thereafter by burning it at a glass softening point or more. An amorphous film of silica, alumina, or the like, can be formed by coating a metallic alkoxide by using a sol-gel process and thereafter by burning it.

Note that it is preferred that the glassy film is formed to cover the thick-film type thermoelectric material, and at the same time to cover the surface of the substrate which holds the thick-film type thermoelectric material. Specifically, it is preferred that the glassy film is formed so as to enclose the thick-film type thermoelectric material together with the substrate.

The present thick-film type thermoelectric device has a small thermal capacity, because it employs the thin substrate. Further, it exhibits a large thermoelectromotive force, because it employs the thick-film type thermoelectric material. Accordingly, it is actuated quickly by heat, and can produce a predetermined output in a short period of time. Moreover, it exhibits large mechanical strength as a device, because the glassy film increases the bonding strength between the thermoelectric material and the substrate. In addition, the oxidation resistance of the thick-film type thermoelectric material is upgraded, because the glassy film encloses the pores in the thermoelectric material to inhibit oxidative gases from coming into the pores. Thus, the present thick-film type thermoelectric device is affluent in oxidation resistance as well as durability.

Preferred embodiments according to the present invention will be hereinafter described.

(First Preferred Embodiment)

FIG. 1 illustrates a perspective view of this preferred embodiment of the present thick-film type thermoelectric device. This thick-film type thermoelectric device is constituted by a metallic substrate 1, an insulation film 2 which is formed on the substrate 1, a thick-film type thermoelectric material 3 formed on the insulation film 2, and a pair of lead wires 4.

The metallic substrate 1 is made from a stainless steel, and comprises a substrate body 10 which has a thickness of 0.2 mm, a base-end width of 40 mm, a leading-end width of 10 mm, and a length of 60 mm, and legs 11 which extend downwardly from both opposite sides on the base-end side of the substrate body 10 and further extend horizontally, and which has a width of 20 mm. The insulation film 2 is formed of a ceramics film whose major component is a silica fine powder, and has a thickness of 0.2 mm. This insulation film 2 is formed on the entire top surface of the substrate body 10 of the substrate 1.

The thermoelectric material 3 is made up of three sets of thermoelectric materials which are connected in series, and each set of which includes a pair of thermoelectric materials. A first set is formed of a p-type thermoelectric material 31 which extends along the left-end side of the substrate body 10, and an n-type thermoelectric material 32 which is connected with the p-type thermoelectric material 31 horizontally at the leading-end side of the substrate body 10, and which extends along the p-type thermoelectric material 31 with a small interval disposed therebetween. Moreover, a second set is formed of a p-type thermoelectric material 33 which is connected with the n-type thermoelectric material 32 of the first set horizontally at the base-end side of the substrate body 10, and which extends along the n-type thermoelectric material 32 with a small interval disposed therebetween, and an n-type thermoelectric material 34 which is connected with the p-type thermoelectric material 33 horizontally at the leading-end side of the substrate body 10, and which extends along the p-type thermoelectric material 33 with a small interval disposed therebetween. Likewise, a third set is formed of a p-type thermoelectric material 35, and an n-type thermoelectric material 36.

All of the p-type thermoelectric materials 31, 33 and 35 had a composition, $Fe_{0.92}Si_{2.5}Mn_{0.08}$. Moreover, all of the n-type thermoelectric materials 32, 34 and 36 had a composition, $Fe_{0.98}Si_{2.5}Co_{0.02}$. These were prepared by baking in the following manner: the p-type and n-type thermoelectric materials were pulverized respectively to a powder having an average particle diameter of about 10 $\mu$m; the resulting powders were respectively turned into a paste state by mixing with a turpentine oil, and then the resulting pastes were coated on the insulation film 2; after removing the turpentine oil by heating, the resulting coatings were heated to 1,217.5° C. to completely fuse both of the p-type and n-type thermoelectric materials in a vacuum of $1\times10^{-3}$ Torr or less; and thereafter the resulting coatings were cooled gradually. Note that the thermoelectric materials had a thickness of 0.9 mm after burning. When the coating was held at a temperature of 760° C. for 12 hours in the gradual cooling, the β-phases were precipitated in the thermoelectric material 3. Note that, on the leading-end side, the width of the connection between the p-type and n-type thermoelectric materials was 2 mm, and the thickness thereof was 0.2 mm. Also note that, concerning the atmosphere in which the coatings were heated to 1,217.5° C., the same result could be obtained either in a reducing atmosphere or in an inert gas atmosphere.

In addition, on the superficial portion of the insulation film 2 on which the thermoelectric materials were coated, an adhesive layer had been formed by sputtering in advance. The adhesive layer was composed of a thin film (a thickness of 1 μm) made from pure iron. Note that the pure-iron thin film was absorbed by the thermoelectric materials in the heating. The two lead wires 4 were soldered on a thin film (a thickness of 1 μm) made from pure iron. The pure-iron thin film had been formed by sputtering in advance at the ends of the p-type thermoelectric material 31 and the n-type thermoelectric material 36. The lead wires 4 could be bonded thereon by a conductive adhesive.

The thick-film type thermoelectric device of this preferred embodiment was heated to 800° C. on the leading-end side, and was held at 120° C. on the base-end side, thereby setting a temperature difference at 680° C. therebetween. At this moment, a thermoelectromotive force of 1.2 V was generated between the two lead wires 4.

Then, the results of studies on the burning conditions, the compositions of the thermoelectric materials, the types of the substrate, and the existence and non-existence of the adhesive layer, which were employed in this preferred embodiment, will be hereinafter described.

Figure 2:
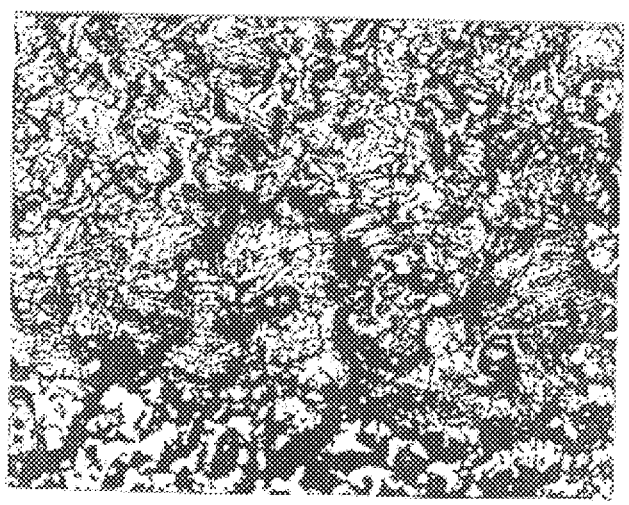
FIG. 2 is an electron micrograph for showing a metallic structure of a thermoelectric material constituting the preferred embodiment.
Figure 3:
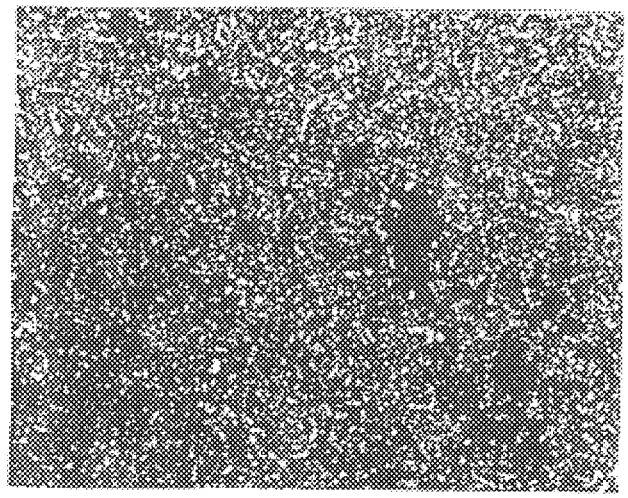
FIG. 3 is an electron micrograph for showing a metallic structure of a raw thermoelectric material which was sintered at a temperature of the melting point or less.

In the preferred embodiment, the thermoelectric materials were burned at 1,217.5° C. This burning temperature was identical with the melting point, 1,217.5° C., of the n-type thermoelectric material. A metallic structure of the thermoelectric material 3 obtained in the preferred embodiment is enlarged and shown in FIG. 2. It is appreciated therefrom that large crystals grew therein. As one of the examples of the burning carried out at the melting point or less, a metallic structure of the thermoelectric material of a thick-film type thermoelectric device is enlarged and shown in FIG. 3, thermoelectric material which was sintered at 1,190° C., a temperature of the melting point or less. It is appreciated therefrom that a metallic structure can be observed in which particles having the same size as that of the raw material powder were sintered.

Figure 4:
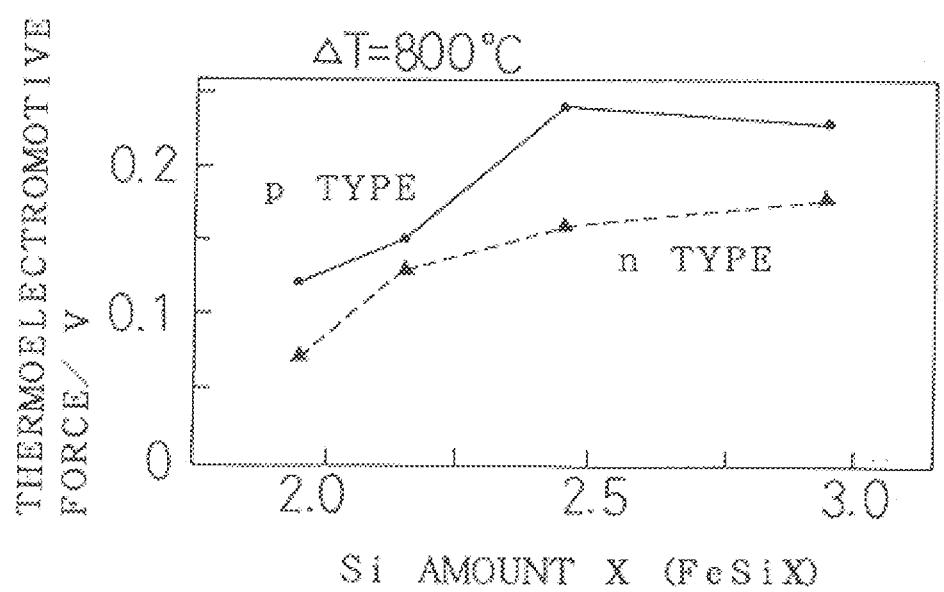
FIG. 4 is a diagram for illustrating relationships between "x" in $FeSi_x$, i.e., a material composition of a raw thermoelectric material, and a thermoelectromotive force.

The results of studies on the compositions of the thermoelectric materials are illustrated in FIG. 4. FIG. 4 specifies the value "x" of $FeSi_x$ on the horizontal axis, and the thermoelectromotive force of the resulting p-type and n-type thermoelectric materials on the vertical axis. Note that the burning was carried at 1,210° C., the same temperature as that of the preferred embodiment. It is understood therefrom that both of the p-type and n-type thermoelectric materials produced a high thermoelectromotive force when the amount of Si with respect to that of Fe (i.e., the Si amount) was 1:2 or more.

Figure 5:
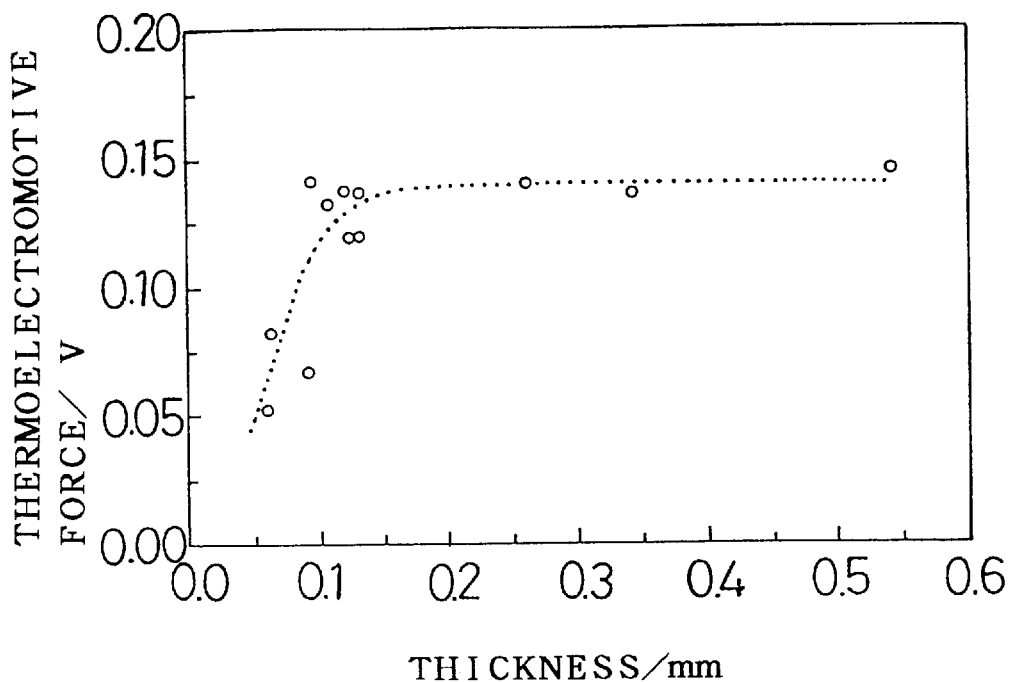
FIG. 5 is a diagram for illustrating a relationship between a thickness of a raw thermoelectric material and a thermoelectromotive force.
Figure 6:
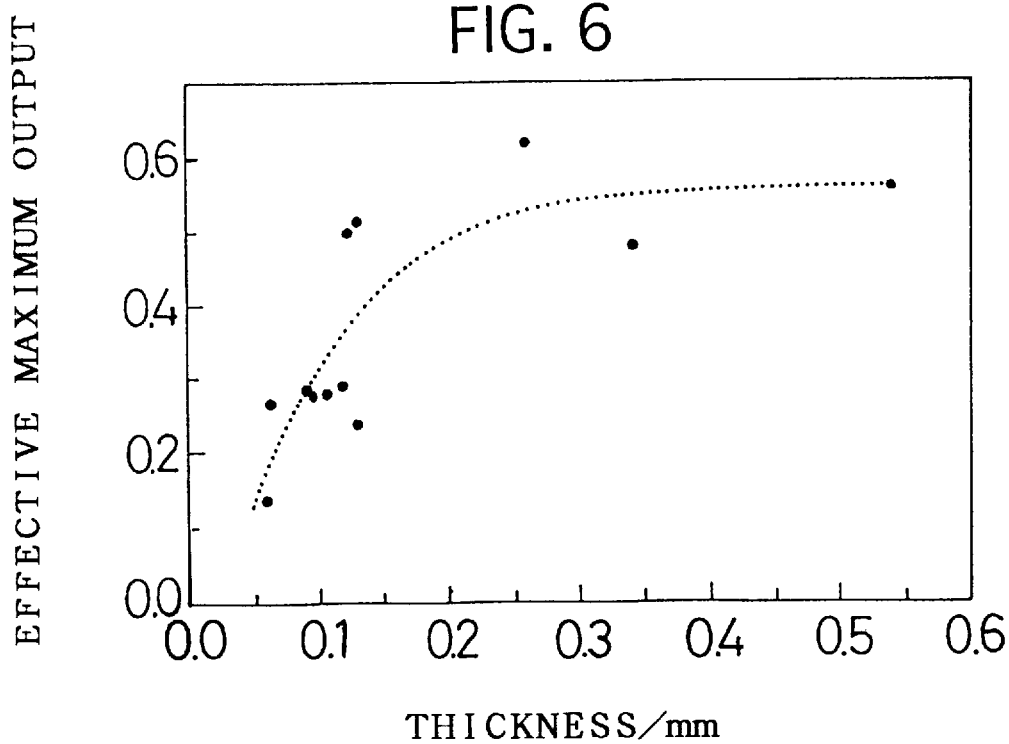
FIG. 6 is a diagram for illustrating a relationship between a thickness of a raw thermoelectric material and an effective maximum output.

The relationship between a thickness of a thick-film type thermoelectric material and a thermoelectromotive force thereof is illustrated in FIG. 5, and the relationship between a thickness thereof and an effective maximum output thereof is illustrated in FIG. 6. As for the thick-film type thermoelectric material, a thermoelectric material having a composition of $Fe_{0.92}Si_{2.0}Mn_{0.08}$ was employed. It is seen from FIG. 5 that the thermoelectromotive force decreased sharply when the thickness was less than 0.1 mm. Likewise, in the relationship between the thickness and the effective maximum output, it is appreciated that the output dropped when the thickness was as thin as about 0.1 mm. According to FIGS. 5 and 6, it is understood that the thickness can preferably be 0.1 mm or more.

Figure 7:
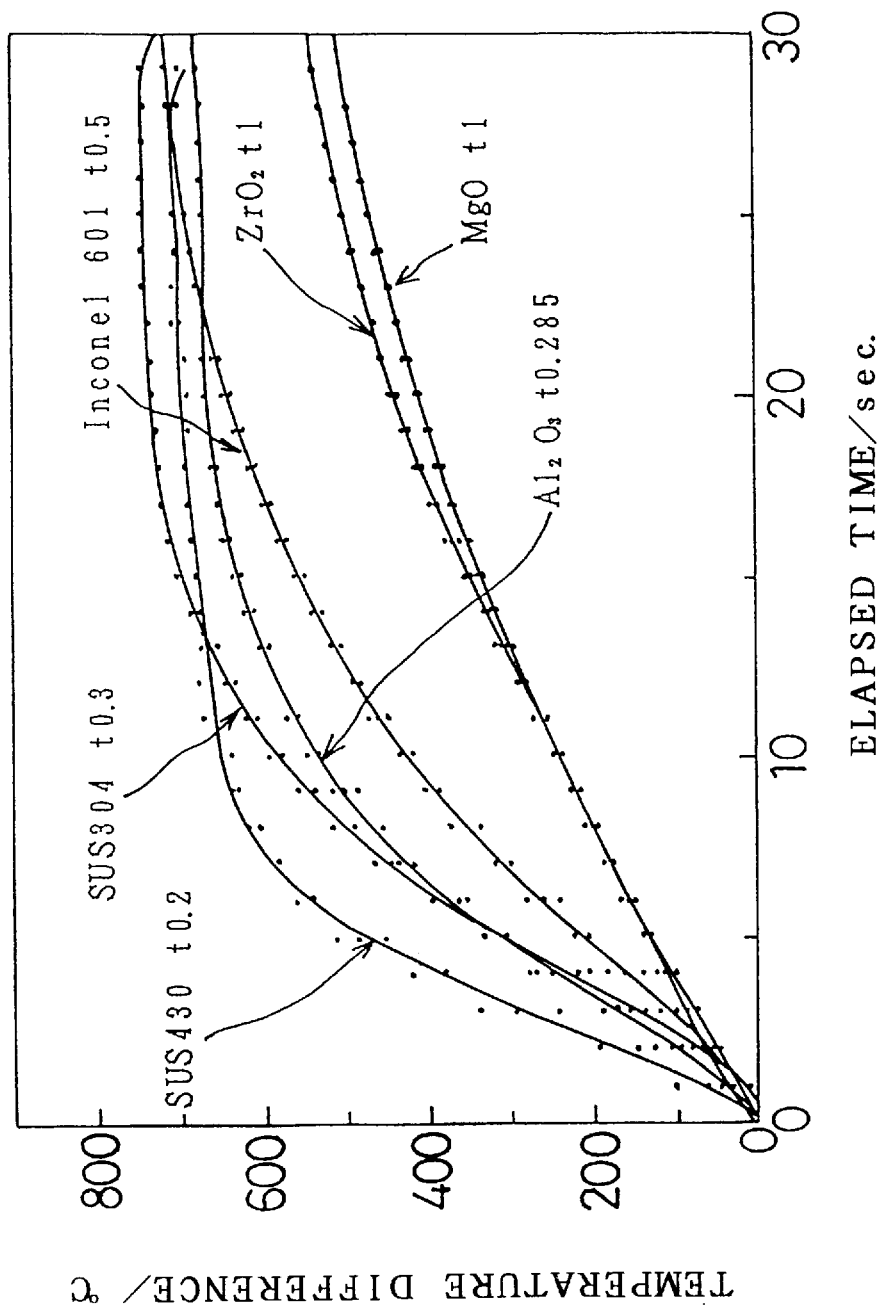
FIG. 7 is a diagram for illustrating relationships between an elapsed heating time and a temperature difference, relationships which were exhibited by specific kinds of substrates.

The types of the substrate studied are listed in Table 2. The relationships between a temperature difference and a heating time are illustrated in FIG. 7 for each of the substrate types. The temperature difference herein means a temperature difference between a leading-end-side temperature of the substrate and a base-end-side temperature thereof. According to the results shown in FIG. 7, it is found that the thinner the substrate was, the more rapidly the leading end was heated to an elevated temperature in a short period of time. Moreover, the substrate made from stainless steel was found to be heated faster than the substrate made from ceramics. Thus, it is understood that a substrate of low thermal capacity is good.

TABLE 2

| Material | Tensile Strength (kg/cm$^2$) | Specific Heat (J/kgK) | Melting Point (°C.) | Thermal Expansion Coefficient (10$^{-6}$/°C.) | Heat Conductivity (W/mK) | Specific Gravity (kg/m$^3$) |
| --- | --- | --- | --- | --- | --- | --- |
| (Target Value) | — | — | >1300 | 10–12 | the smaller, the better | — |
| INCONEL 601 | 5500 | 448 | 1320 | 16.74 | 25.6 | 8050 |
| SUS304 | 5910 | 502 | 1430 | 17.3 | 16.2 | 8030 |
| SUS430 | 5270 | 411 | 1430 | 10.5 | 26.0 | 7770 |
| MgO | 102 | 100 | 2800 | 12.0 | 7.1 | 3560 |
| ZrO$_2$ | 703 | 110 | 2600 | 10.4 | 2.93 | 715 |

The composition of INCONEL is 58–63% of Ni(+Co), 21–25% of Cr, 1–1.7% of Al, less than 1% of Mn and the balance of Fe.

SUS304, SUS430 are alloys of stainless steel which are prescribed by JIS (Japanese Industrial Standard).

The composition of SUS304 is not more than 0.08% of C, not more than 1.00% of Si, not more than 2.00% of Mn, not more than 0.045% of P, not more than 0.030% of S, 8.00–10.5% of Ni, 18.00–20.00% of Cr and the balance of Fe.

The composition of SUS430 is not more than 0.12% of C, not more than 0.75% of Si, not more than 1.00% of Mn, not more than 0.040% of P, not more than 0.030% of S, 16.00–18.00% of Cr and the balance of Fe.

Figure 8:
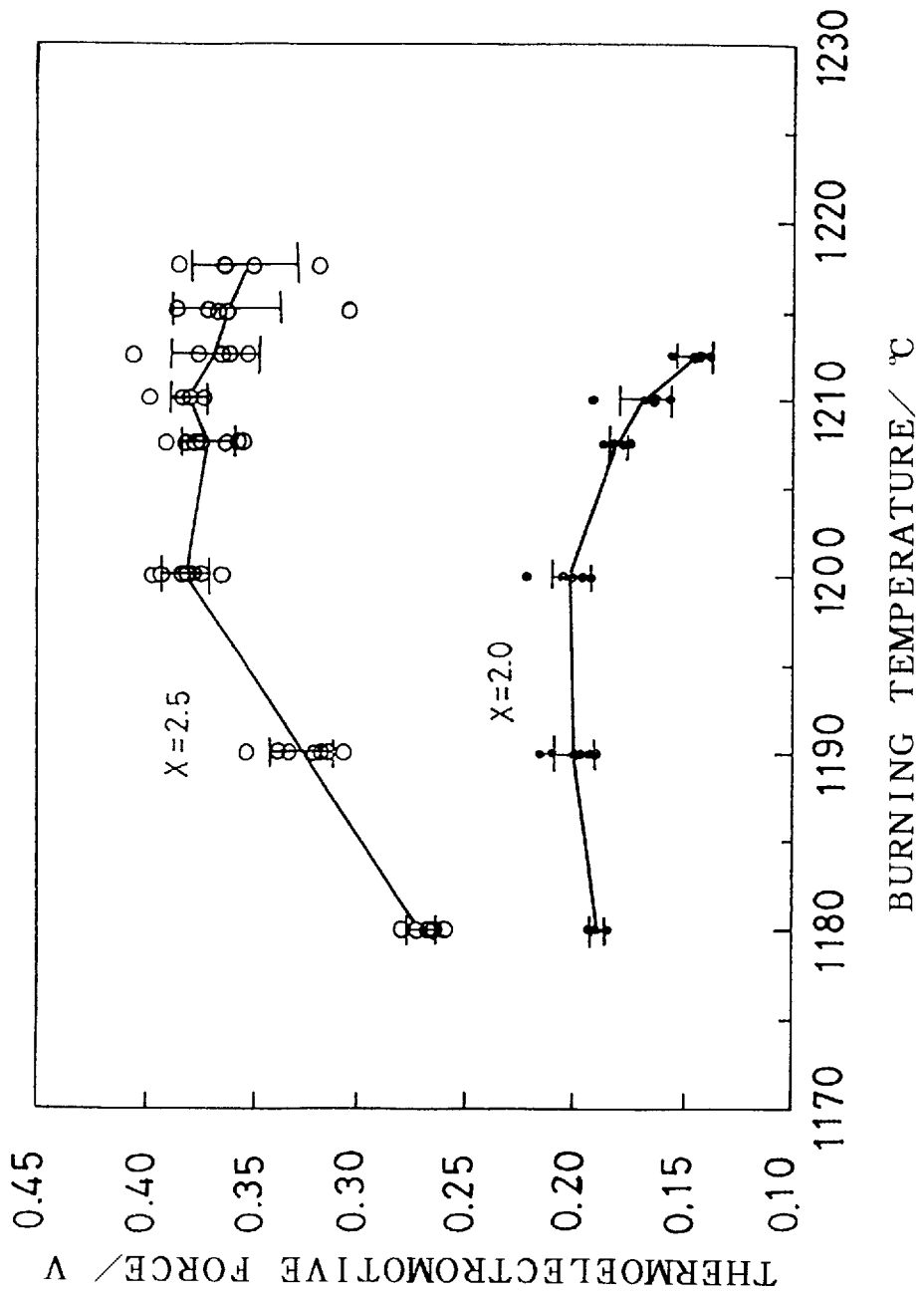
FIG. 8 is a diagram for illustrating relationships between a burning temperature and a thermoelectromotive force.
Figure 9:
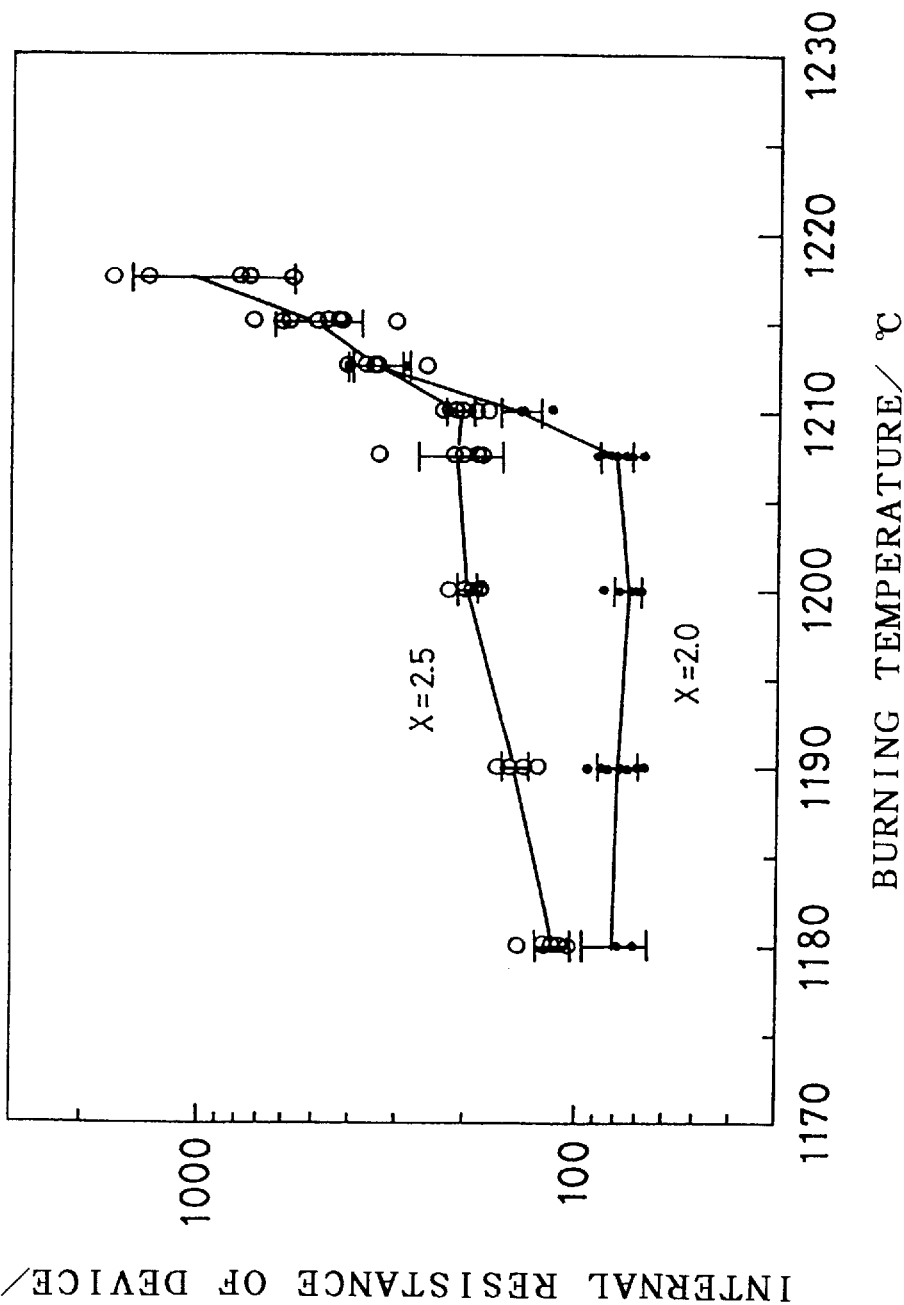
FIG. 9 is a diagram for illustrating relationships between a burning temperature and an internal resistance of a thick-film thermoelectric device.
Figure 10:
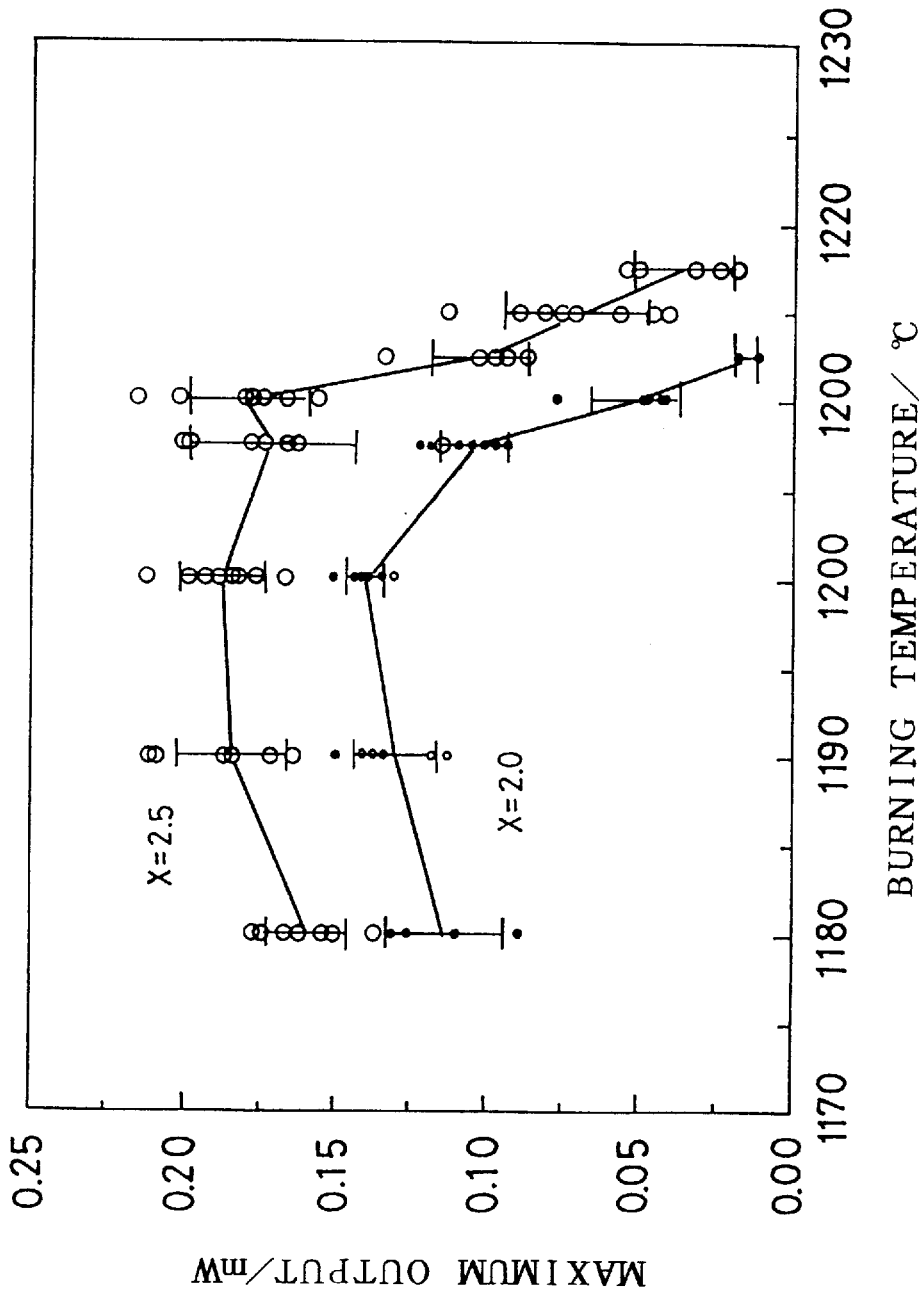
FIG. 10 is a diagram for illustrating relationships between a burning temperature and a maximum output.

In order to further investigate the composition of the thermoelectric material and a burning temperature therefor, a pair of thermoelectric materials were burned in a temperature range, which was varied from 1,180° to 1217.5° C., to prepare thermoelectric devices. The thermoelectric materials had a composition of $Fe_{0.92}Si_xMn_{0.08}$ and $Fe_{0.98}Si_xCo_{0.02}$ in which the value "x" was 2.0 and 2.5, respectively. The resulting thermoelectric devices were measured for the thermoelectromotive force, the internal resistance and the maximum output. The results obtained are illustrated in FIGS. 8, 9 and 10, respectively. The horizontal axis specifies the burning temperature in each of the drawings, the vertical axis specifies the thermoelectromotive force in FIG. 8, the internal resistance of the devices in FIG. 9, and the maximum output in FIG. 10. Note that a glassy film was baked on the surface of the thermoelectric devices in order to inhibit the thermoelectric materials from oxidizing.

As illustrated in FIG. 8 and FIG. 10, it is found that the thermoelectric material having a larger amount of Si with respect to that of Fe (i.e., the value "x") exhibited a higher thermoelectromotive force and maximum output: namely; the thermoelectric material having "x"=2.5 exhibited a thermoelectromotive force and maximum output higher than the thermoelectric material having "x"=2.0.

As for the burning temperature, the thermoelectric material having "x"=2.0 started to exhibit a decreased thermoelectromotive force when the burning temperature exceeded 1,200° C. The thermoelectric material having "x"=2.5 apparently exhibited a virtually similar tendency. This results from the fact that the p-type thermoelectric material having "x"=2.0 had a melting point of 1,207° C., the n-type thermoelectric material having "x"=2.0 had a melting point of 1,212.5° C., the p-type thermoelectric material having "x"=2.5 had a melting point of 1,210° C., and the n-type thermoelectric material having "x"=2.5 had a melting point of 1,217.5° C. In particular, as explicitly illustrated in FIG. 9, the internal resistance of the resulting devices was increased considerably when the thermoelectric materials were burned at a temperature of 1,210° C. or more. Due to the increment of the internal resistance, the maximum output was decreased as illustrated in FIG. 10.

This phenomenon resulted from the mutual diffusing of dopant elements which were caused by fusing. Accordingly, when employing a technique in which the p-type and n-type thermoelectric materials are directly bonded to each other, it is preferred to bake the p-type and n-type thermoelectric materials at a temperature of their melting points or less, or to bond each of the p-type and n-type thermoelectric materials by way of a conductive member.

As for the conductive member for bonding, it is convenient to employ a paste. As a result of experimental studies on the paste, it was found that, when a maximum service temperature is relatively low, an Ag—Pd paste, which includes a glass powder as a binder, is preferable as the paste material. The Ag—Pd paste is good in terms of the response characteristic to the thermoelectromotive force, and exhibits a small internal resistance which is indispensable to p-n bonding.

Figure 11:
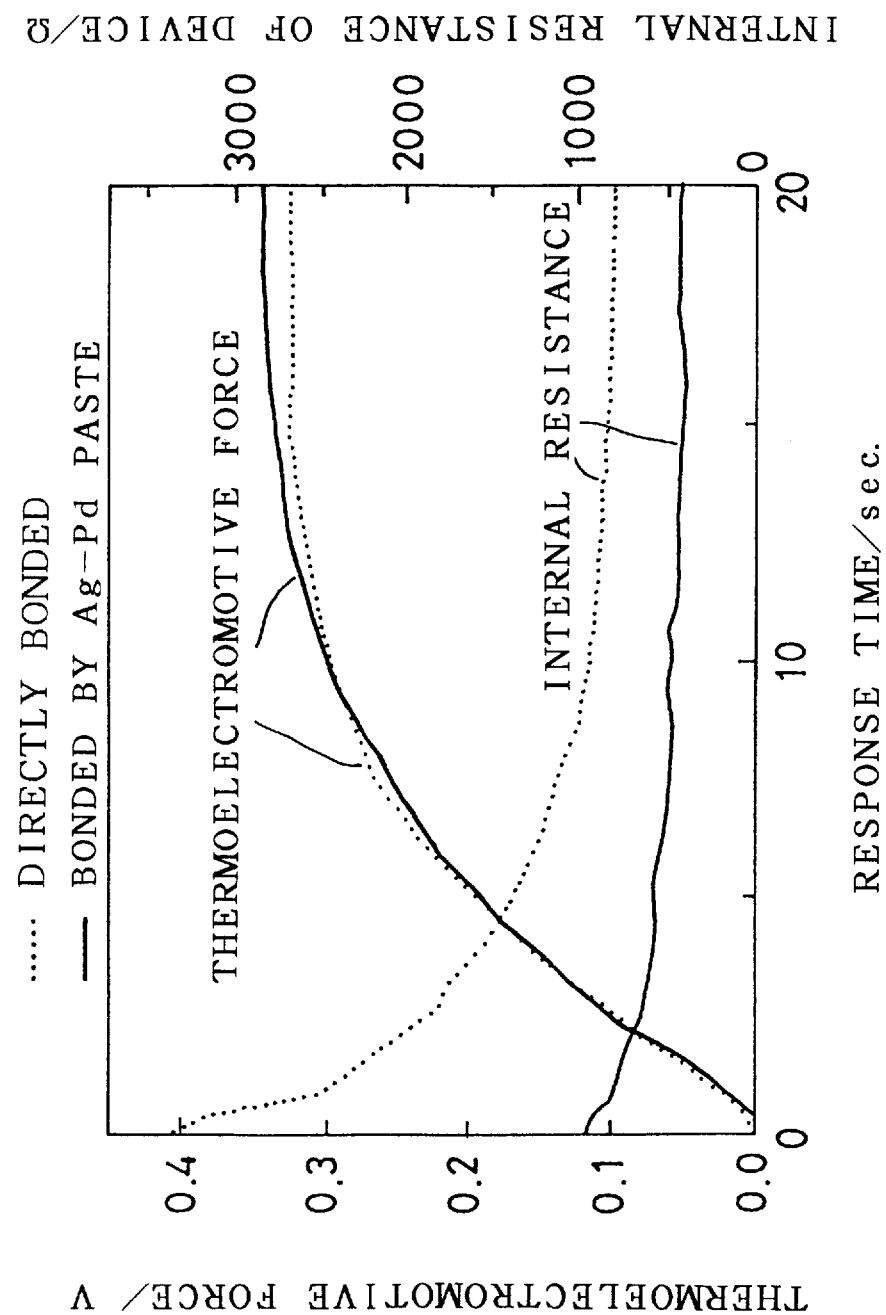
FIG. 11 is a diagram for illustrating relationships between a response time and a thermoelectromotive force, and between a response time and an internal resistance, relationships which were exhibited by a thermoelectric device with a pair of p-type and n-type thermoelectric materials that were connected directly, and by a thermoelectric device with a pair of p-type and n-type thermoelectric materials that were connected indirectly.

For reference, the characteristics of the thick-film type thermoelectric device in which the p-type and n-type thermoelectric materials were directly bonded, and the characteristics of the thick-film type thermoelectric device in which they were indirectly bonded by using the Ag—Pd paste are illustrated in FIG. 11. The thick-film type thermoelectric devices had the same configuration as that of the above-described preferred embodiment. Concerning the p-type and n-type thermoelectric materials, a pair of thermoelectric materials were employed whose compositions were $Fe_{0.92}Si_{2.5}Mn_{0.08}$ and $Fe_{0.98}Si_{2.5}Co_{0.02}$ where "x"=2.5, respectively. The burning temperature was set at 1,215° C. which was a temperature higher than 1,210 ° C., the melting point of $Fe_{0.92}Si_{2.5}Mn_{0.08}$, but lower than 1,217.5° C., the melting point of $Fe_{0.98}Si_{2.5}Co_{0.02}$.

As for the characteristic values, the thermoelectromotive force with respect to the response time (the time for heating the bonded portion), and the internal resistance were employed. The values of the directly-bonded thick-film type thermoelectric device were specified by the dotted lines, and the values of the indirectly-bonded or Ag—Pd-paste-bonded thick-film type thermoelectric device were specified by the solid lines.

As can be seen from FIG. 11, the directly-bonded thick-film type thermoelectric device exhibited a high internal resistance. Consequently, after 10 seconds passed, the thermoelectromotive force of the thick-film type thermoelectric device, which was indirectly-bonded by the Ag—Pd paste, was higher than that of the directly-bonded thick-film type thermoelectric device.

(Second Preferred Embodiment)

The identical device with the thick-film type thermoelectric device of the First Preferred Embodiment was used as it was. A ceramic adhesive was coated on the surfaces of the thermoelectric material 3 and insulation film 2 of the thick-film type thermoelectric device, and held at a temperature of 760° C. for 6 hours in air. In this way, a glassy film was formed on the surfaces of the thermoelectric material 3 and insulation film 2. The thick-film type thermoelectric device of the Second Preferred Embodiment was thus formed.

The thick-film type thermoelectric device of the Second Preferred Embodiment was heated to 800° C. on the leading-end side, and was held at 120° C. on the base-end side. When the temperature difference was thus set at 680° C., a thermoelectromotive force of 1.2 V was generated between the two lead wires 4.

In order to examine the durability of the thick-film type thermoelectric device of the Second Preferred Embodiment, the leading end of the thick-film type thermoelectric device was heated continuously to about 750° C. by a gas flame, which was formed by burning a natural gas in air, in order to measure a variation rate of the resistance. The variation rate of the resistance was calculated by the following equation:

$$[\{(\text{Resistance during Measurement})-(\text{Resistance before Heating})\}/(\text{Resistance before Heating})]\times 100(\%).$$

Figure 12:
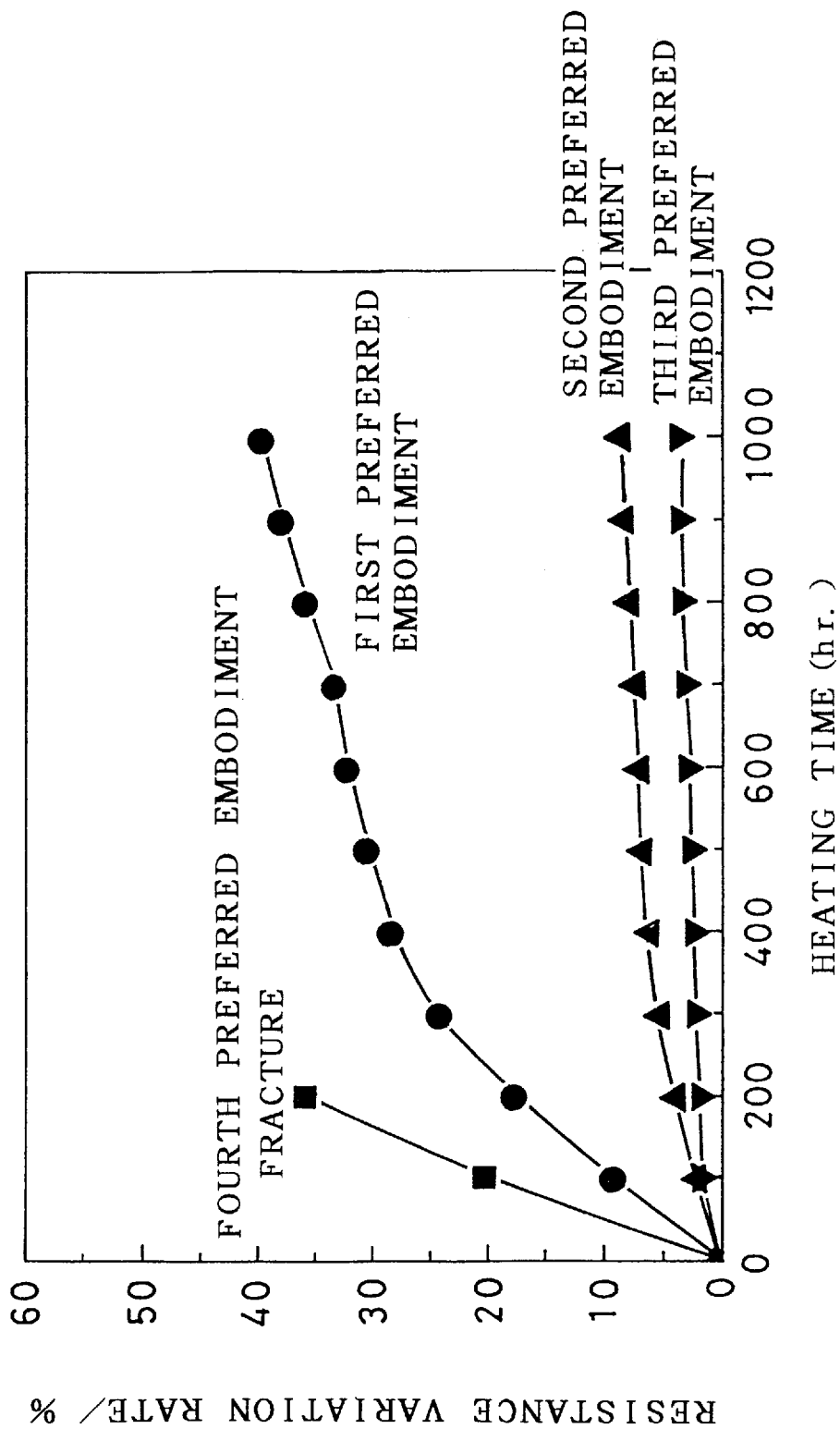
FIG. 12 is a diagram for illustrating relationships between a heating time and a resistance variation rate, relationships which were exhibited by thick-film type thermoelectric devices according to First through Fourth Preferred Embodiments.

The results are illustrated in FIG. 12. Note that, in FIG. 12, the horizontal axis specifies the heating time, and the vertical axis specifies the variation rate of the resistance. It is apparent from the diagram of the Second Preferred Embodiment in FIG. 12 that the variation rate of the resistance fell within 10% when 1,000 hours passed. Thus, the Second Preferred Embodiment was found to exhibit the resistance variation less. In addition, no drawbacks, such as a thermoelectric material 3 that was come off from the substrate 1, or the like, were seen during the durability test.

Figure 13:
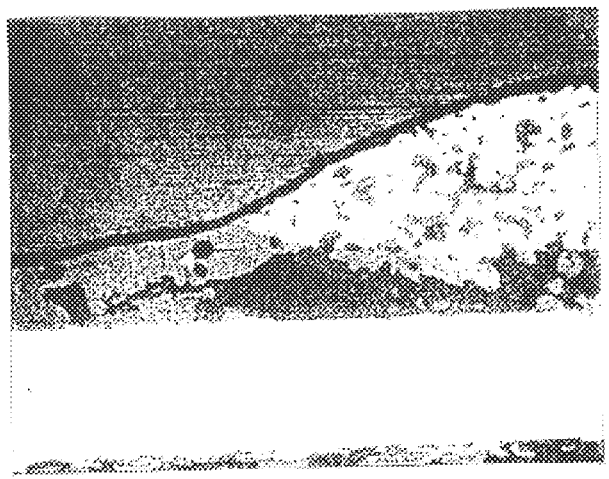
FIG. 13 is a microphotograph for showing a major cross-section of a thick-film type thermoelectric device according to a Second Preferred Embodiment.
Figure 14:
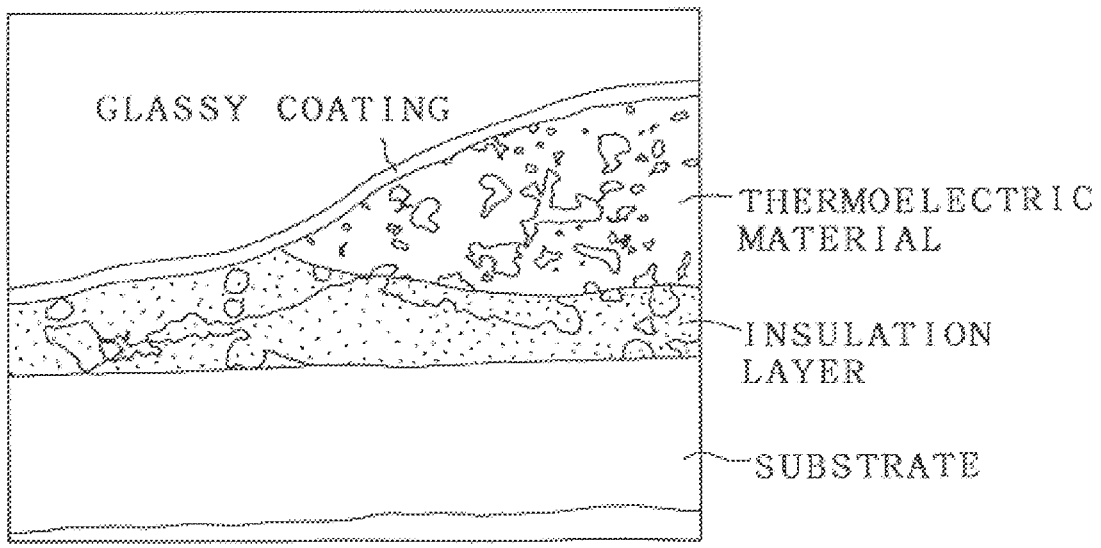
FIG. 14 is a sketch based on FIG. 13.

For reference, a photomicrograph on a major portion of a cross-section of this preferred embodiment is shown in FIG. 13. Moreover, a sketch of FIG. 13 is shown in FIG. 14. It is apparent from FIG. 13 and FIG. 14 that the insulation film 2 was found to be adhered closely onto the upper surface of the substrate 1, and the thermoelectric material 3 was found to be further closely adhered on the insulation film 2. In addition, the glassy film was found to be coated integrally on the surfaces of the insulation film 2 and thermoelectric material 3.

(COMPARATIVE EXAMPLE)

In forming a comparative thick-film type thermoelectric material, only the thickness of the thermoelectric material 3 of the Second Preferred Embodiment was set at 1.2 mm. Unless otherwise specified, the comparative thick-film type thermoelectric device was formed in a completely identically manner with that of the Second Preferred Embodiment. In the comparative example of the thick-film type thermoelectric device, the thermoelectric material came off from the substrate when burning the thermoelectric material. Thus, no complete thick-film type thermoelectric device could be obtained.

(Reference)

For reference, the leading end of the thick-film type thermoelectric device of the First Preferred Embodiment was heated continuously to about 750° C. by a gas flame, which was formed by burning a natural gas in air, in order to measure a variation rate of the resistance. The results of this measurement are also shown in FIG. 12 along with those of the Second Preferred Embodiment.

It is apparent from FIG. 12 that the resistance was varied greatly by heating, and that the resistance was increased by 35% or more when 1,000 hours passed. In addition, the leading-end portion of the thermoelectric material was observed to come off slightly from the substrate.

(Third Preferred Embodiment)

Instead of the ceramic adhesive employed in th e Second Preferred Embodiment, a paste-like substance was prepared by adding a turpentine oil to a glass powder which had a softening point of about 800° C. Except that the paste-like substance was used, the thick-film type thermoelectric device was manufactured in exactly the same manner as the Second Preferred Embodiment. In order to examine the durability of the thick-film type thermoelectric device of the Third Preferred Embodiment, the leading end of the thick-film type thermoelectric device was heated continuously to about 750° C. by a gas flame, which was formed by burning a natural gas in air, in exactly the same manner as the Second Preferred Embodiment, and thereby a variation rate of the resistance was measured. The results of this measurement are also incorporated in FIG. 12 together with those of the First and Second Preferred Embodiments.

It is appreciated from FIG. 12 that the variation of the resistance was 5% or less when 1,000 hours passed, and that no drawbacks, such as coming-off, or the like, were observed. Thus, the thick-film type thermoelectric device of the Third Preferred Embodiment exhibited exceptionally good durability, and the glassy coating effected remarkable advantages.

(Fourth Preferred Embodiment)

As the Fourth Preferred Embodiment, the glassy coating of the thick-film type thermoelectric device of the Second Preferred Embodiment was not formed, and the burning temperature was set at 1,205° C. so to bake the thermoelectric materials without fusing the thermoelectric materials. Unless otherwise specified, the thick-film type thermoelectric device of the Fourth Preferred Embodiment was formed in exactly the same manner as the Second Preferred Embodiment.

In order to examine the durability of the thick-film type thermoelectric device of the Fourth Preferred Embodiment, the leading end of the thick-film type thermoelectric device was heated continuously to about 750° C. by a gas flame, which was formed by burning a natural gas in air, in exactly the same manner as the Second Preferred Embodiment, and thereby a variation rate of the resistance was measured. The results of this measurement are also shown in FIG. 12 along with those of the First, Second and Third Preferred Embodiments.

It is obvious from FIG. 12 that the resistance was varied considerably by heating, and that the resistance was increased by 35% or more when the heating was carried out for 200 hours. In addition, when the heating was carried out for 200 hours, the thermoelectric materials were come off from the leading end of the device, and the leading end was fractured. It is believed that the durability was further inferior to that of the thick-film type thermoelectric material of Comparative Example No. 2 because of the following reason: namely, the thermoelectric materials formed herein were baked without fusing, and accordingly the resulting thermoelectric materials were more porous so as to be deficient in oxidation resistance.

(Fifth Preferred Embodiment)

Instead of the ceramic adhesive employed in the Second Preferred Embodiment, a metallic alkoxide substance was coated in the Fifth Preferred Embodiment. Unless otherwise specified, the thick-film type thermoelectric device of the Fifth Preferred Embodiment was manufactured in exactly the same manner as the Second Preferred Embodiment. In order to examine the durability of the thick-film type thermoelectric device of the Fifth Preferred Embodiment, the leading end of the thick-film type thermoelectric device was heated continuously to about 750° C. by a gas flame, which was formed by burning a natural gas in air, in exactly the same manner as the Second Preferred Embodiment, and thereby a variation rate of the resistance was measured.

According to the measurement, the variation of the resistance was 5% or less when 1,000 hours passed, and no drawbacks, such as coming-off, or the like, were observed.

Thus, the thick-film type thermoelectric device according to the present invention holds a characteristic in that it produces a high output in a short period of time. In addition, it exhibits mechanical strength, is abundant in oxidation resistance, and is of full durability.

Industrial Applicability

The thick-film type thermoelectric device according to the present invention is applicable to sensors for detecting the presence of flames, such as burners, and to auxiliary power sources for automobiles. Because of the addition of a wide variety of electric appliances, the recent automobiles consume more electricity, and the capacity of the batteries is likely to be insufficient. Therefore, there arise needs to generate electric power by thermoelectric devices, and to charge batteries by them.

We claim:

1. A thick-film thermoelectric device, comprising:
   a substrate having a thickness of 2.0 mm or less; and
   at least one pair of thick-film thermoelectric materials formed on said substrate, a thickness of said thermoelectric materials being from 0.13 mm to 1.0 mm, and being composed of a p-type thermoelectric material and an n-type thermoelectric material, the p-type thermoelectric material and the n-type thermoelectric material being connected with each other at an end thereof.

2. The thick-film thermoelectric device according to claim 1, wherein said at least one pair of thick-film thermoelectric materials are formed on one surface of said substrate and a second of said at least one pair of thick-film thermoelectric materials are formed on an opposite surface of said substrate.

3. The thick-film thermoelectric device according to claim 1, wherein said pair of thick-film thermoelectric materials, formed on said substrate, are covered with a glassy coating.

4. The thick-film thermoelectric device according to claim 3, wherein said glassy coating is composed of sodium silicate, a glass powder, or a metallic alkoxide.

5. The thick-film thermoelectric device according to claim 1, wherein said substrate is a ceramics plate exhibiting a thermal expansion coefficient of from $6 \times 10^{-6}/°C$. to $13 \times 10^{-6}/°C$.

6. The thick-film thermoelectric device according to claim 5, wherein said ceramics plate is composed of alumina, zirconia, magnesia, or forsterite.

7. The thick-film thermoelectric device according to claim 1, wherein said substrate includes:
   a metallic plate exhibiting a thermal expansion coefficient of from $10 \times 10^{-6}/°C$. to $20 \times 10^{-6}/°C$. at room temperature; and
   an insulation layer formed on a surface of the metallic plate.

8. The thick-film thermoelectric device according to claim 7, wherein said metallic plate is a stainless plate having a thickness of 2.0 mm or less, or a heat-resistant alloy plate including Ni in an amount of 30% by weight or more.

9. The thick-film thermoelectric device according to claim 1, wherein said pair of thick-film thermoelectric materials are connected with each other at an end thereof directly.

10. The thick-film thermoelectric device according to claim 1, wherein said pair of thick-film thermoelectric materials are connected with each other at an end thereof by way of another conductive material indirectly.

11. The thick-film thermoelectric device according to claim 1, wherein said pair of thick-film thermoelectric materials are fused temporarily, and are baked on said substrate.

12. The thick-film thermoelectric device according to claim 1, wherein said pair of thick-film thermoelectric materials are sintered at a temperature of their respective melting points or less, and are baked on said substrate.

13. The thick-film thermoelectric device according to claim 1, wherein said p-type thermoelectric material and said n-type thermoelectric material includes a transition metal silicide-based material with excessive Si over the stoichiometric composition.

14. The thick-film thermoelectric device according to claim 13, wherein said transition metal silicide-based material is $FeSi_y$, in which y is $2.1<y<4$, and which includes $\beta$-$FeSi_2$ phase.

15. The thick-film thermoelectric device according to claim 14, wherein a dopant of said iron silicide-based material is at least one member selected from the group consisting of Mn, Al and Cr in said p-type thermoelectric material, and a dopant of said iron silicide-based material is at least one member selected from the group consisting of Co, Ni, P and Cu in said n-type thermoelectric material.

16. A thick-film thermoelectric device, comprising:
   a substrate having a thickness of 2.0 mm or less; and
   a thick-film thermoelectric material formed on said substrate, and having a thickness of from 0.13 mm to 1.0 mm;
   wherein said thick-film thermoelectric material is soaked with a glassy material.

17. The thick-film thermoelectric device according to claim 16, wherein said glassy material is a ceramic adhesive, a glass powder, or a metallic alkoxide, and thereafter baked.

18. The thick-film thermoelectric device according to claim 16, wherein said substrate is a ceramics plate exhibiting a thermal expansion coefficient of from $6\times10^{-6}/°C$. to $13\times10^{-6}/°C$.

19. The thick-film thermoelectric device according to claim 18, wherein said ceramics plate is formed of alumina, zirconia, magnesia, or forsterite.

20. The thick-film thermoelectric device according to claim 16, wherein said substrate is composed of:
   a metallic plate exhibiting a thermal expansion coefficient of from $10\times10^{-6}/°C$. to $20\times10^{-6}/°C$. at room temperature; and
   an insulation layer formed on a surface of the metallic plate.

21. The thick-film thermoelectric device according to claim 16, wherein said thick-film thermoelectric material is composed of a p-type thermoelectric material and an n-type thermoelectric material which are connected with each other at an end thereof.

22. The thick-film thermoelectric device according to claim 21, wherein a pair of said p-type thermoelectric material and said n-type thermoelectric material include a transition metal silicide-based material with excessive Si over the stoichiometric composition.

23. A thick-film thermoelectric device, comprising:
   a substrate having a thickness of 2.0 mm or less, and
   a pair of thick-film thermoelectric materials formed on said substrate, having a thickness of from 0.13 mm to 1.0 mm, and being composed of a p-type thermoelectric material and an n-type thermoelectric material, the p-type thermoelectric material and the n-type thermoelectric material connected with each other at an end thereof,
   said p-type thermoelectric material and said n-type thermoelectric material include a metal silicide-based material,
   the Si content of said metal silicide-based material being higher than the stoichiometric content of Si of said metal silicide-based material.

24. The thick-film thermoelectric device according to claim 23, wherein said p-type thermoelectric material and said n-type thermoelectric material includes a transition metal silicide-based material with excessive Si over the stoichiometric composition.

25. The thick-film thermoelectric device according to claim 24, wherein said transition metal silicide-based material is $FeSi_y$, in which y is $2.1<y<4$, and which includes $\beta$-$FeSi_2$phase.

26. The thick-film thermoelectric device according to claim 25, wherein a dopant of said iron silicide-based material is at least one member selected from the group consisting of Mn, Al and Cr in said p-type thermoelectric material, and a dopant of said iron silicide-based material is at least one member selected from the group consisting of Co, Ni, P and Cu in said n-type thermoelectric material.

27. A thick-film thermoelectric device, comprising:
   a substrate having a thickness of 2.0 mm or less, and
   a thick-film thermoelectric material formed on said substrate, and having a thickness of from 0.13 mm to 1.0 mm,
   said thick-film thermoelectric material being soaked with a glassy material,
   said thick-film thermoelectric material including a metal silicide-based material,
   the Si content of said metal silicide-based material being higher than the stoichiometric content of Si of said metal silicide-based material.

28. The thick-film thermoelectric device according to claim 27, wherein said thick-film thermoelectric material is a pair of p-type thermoelectric material and n-type thermoelectric material includeing a transition metal silicide-based material with excessive Si over the stoichiometric composition.

* * * * *